(12) United States Patent
Gubbins (10) Patent No.: US 6,894,544 B2
(45) Date of Patent: May 17, 2005

(54) BROWN-OUT DETECTOR (75) Inventor: David P. Gubbins, Lisnagry (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/452,856

(22) Filed: Jun. 2, 2003

(65) Prior Publication Data

US 2004/0239413 A1 Dec. 2, 2004

(51) Int. Cl.[7] .............................................. H03L 7/00
(52) U.S. Cl. ..................................... 327/143; 327/198
(58) Field of Search ................................ 327/142, 143, 327/198, 512, 513, 538, 539, 542, 541, 543, 80, 81, 83; 330/289, 256

(56) References Cited

U.S. PATENT DOCUMENTS

| 4,961,102 A | * | 10/1990 | Shideler et al. ............. 257/515 |
| 5,043,599 A | * | 8/1991 | Zitta ........................... 327/65 |
| 5,144,159 A | * | 9/1992 | Frisch et al. ................. 327/143 |
| 5,324,996 A | * | 6/1994 | Mote, Jr. ..................... 326/21 |
| 5,959,477 A |   | 9/1999 | Chung ......................... 327/143 |
| 6,239,630 B1 |   | 5/2001 | Bowers et al. ............... 327/143 |
| 6,437,614 B1 | * | 8/2002 | Chen ........................... 327/143 |
| 6,686,783 B1 | * | 2/2004 | Huang .......................... 327/143 |

* cited by examiner

Primary Examiner—Long Nguyen
(74) Attorney, Agent, or Firm—Wolf, Greenfield & Sacks, P.C.

(57) ABSTRACT

A brown-out detector that continuously monitors power supply voltage and provides an output signal that transitions to a logic HIGH state when the monitored power supply voltage exceeds a predetermined threshold value. One embodiment of the present invention comprises a first voltage reference with respect to ground that varies in direct proportion to absolute temperature, a second voltage reference with respect to the supply voltage that varies inversely with absolute temperature, and a comparator having the first voltage reference coupled to one input, and the second voltage reference coupled to the other input, such that the comparator output changes state when the power supply voltage exceeds a predetermined threshold voltage that is relatively independent of absolute temperature. The circuit may also be configured such that the first voltage reference varies inversely with absolute temperature, while the second voltage reference varies in direct proportion to absolute temperature.

24 Claims, 6 Drawing Sheets

BROWN-OUT DETECTOR

FIELD OF THE INVENTION

This invention relates generally to power supply voltage monitoring and in particular to a circuit that continuously monitors power supply voltage, and is more particularly directed toward a power supply voltage monitoring circuit that provides an output signal when the power supply voltage exceeds a predetermined threshold.

BACKGROUND OF THE INVENTION

It is often necessary in the design of electronic circuitry to ensure that specific portions of a circuit begin operation in a known state. It is also often true that specific types of circuitry do not operate properly unless the power supply voltage is above a certain critical voltage. A circuit that monitors an analog supply voltage, and determines whether the voltage is sufficient for reliable operation of associated circuitry, is often termed a "brown-out detector."

Determining whether the supply voltage has reached a sufficient level can be particularly important when battery-powered equipment is involved. In a battery-powered environment, it is also desirable that any monitoring circuitry employed utilize as little power as possible. In addition, a monitoring circuit should function reliably at a predetermined threshold voltage regardless of operating temperature.

It is also a desirable feature that the monitoring circuit respond predictably to process variations. In many applications, it is actually desirable for monitoring circuit operation to vary with certain process parameters, particularly since process variations can actually impact an electronic circuit's performance specifications, particularly insofar as proper operating supply voltage is concerned.

A power-on reset circuit that is designed to sense and respond to power supply voltage level is described in U.S. Pat. No. 6,239,630. The patent describes a power-on reset circuit that uses all-CMOS circuitry to initiate a reset signal when the circuit's supply voltage is low, then terminates the reset signal when the supply voltage exceeds a reference voltage by at least the greater of PFET and NFET threshold voltages. The heart of the circuit is a diode-connected bipolar transistor that establishes the reference voltage. The disadvantages of this approach are that the threshold voltage level is both process and temperature dependent, and resistors are required that must be large when low power operation is desired.

A precision power-on reset circuit is described in U.S. Pat. No. 5,959,477. This reference is directed toward a circuit that is relatively insensitive to temperature and process variations. Although a bipolar transistor base-emitter junction is utilized, and it is known that $V_{BE}$ has a negative temperature coefficient, resistance ratios and device shape factors are varied to compensate for temperature variation to result in a circuit with minimal sensitivity to both temperature and process changes. However, the BiCMOS process used in constructing this circuit is expensive to implement, and resistors are also required in this implementation.

Consequently, a need arises for a brown-out detector circuit that is relatively insensitive to temperature variation over a wide temperature range, is economical to manufacture both in terms of process cost and in conservation of valuable integrated circuit area, and that demonstrates a predictable and benign response to process variations.

SUMMARY OF THE INVENTION

These needs and others are satisfied by the brown-out detector of the present invention, which continuously monitors power supply voltage and provides an output signal that transitions to a logic HIGH state when the monitored power supply voltage exceeds a predetermined threshold value.

In accordance with one aspect of the present invention, a power supply voltage monitoring circuit that provides an output signal when the power supply voltage measured with respect to ground exceeds a predetermined threshold voltage comprises a first voltage reference with respect to ground that varies in direct proportion to absolute temperature, a second voltage reference with respect to the supply voltage that varies inversely with absolute temperature, and a comparator having the first voltage reference coupled to one input, and the second voltage reference coupled to the other input, such that the comparator output changes state when the power supply voltage exceeds a predetermined threshold voltage that is relatively independent of absolute temperature.

In one form of the invention, the first voltage reference with respect to ground comprises a diode-connected NMOS transistor in series with a current source. Preferably, the source of the diode-connected NMOS transistor is coupled to ground, and the current source is coupled between the power supply voltage and the drain of the diode-connected NMOS transistor.

In another form of the invention, the second voltage reference with respect to the supply voltage comprises a substrate bipolar transistor with a current source coupled to its base. Preferably, the substrate bipolar transistor comprises a substrate PNP transistor. Beta of the substrate PNP transistor is generally no more than about 5, and may be as low as 2 or 3. The emitter of the substrate PNP transistor is coupled to the power supply voltage, the collector of the substrate PNP transistor is coupled to ground, and the current source is coupled between the base of the substrate PNP transistor and ground.

In still another form of the invention, it is preferred that the drain of the diode-connected NMOS transistor in the first voltage reference be coupled to the non-inverting input of the comparator, while the base of the substrate PNP transistor in the second voltage reference is coupled to the inverting input of the comparator. The first voltage reference has a positive temperature coefficient approximately equal to the magnitude of the negative temperature coefficient of the second voltage reference. The comparator is a two-stage comparator having an NMOS input transistor pair.

In yet another form of the invention, a hysteresis circuit is interposed between the first voltage reference and the comparator, the hysteresis circuit comprising a current sink that diverts current from the diode-connected NMOS transistor at a predetermined trigger voltage.

In accordance with another aspect of the present invention, a power supply voltage monitoring circuit that provides an output signal when the power supply voltage measured with respect to ground exceeds a predetermined threshold voltage comprises a first voltage reference with respect to ground that varies in direct proportion to absolute temperature, wherein the first voltage reference with respect to ground comprises a diode-connected NMOS transistor in series with a current source, and a second voltage reference with respect to the supply voltage that varies inversely with absolute temperature, wherein the second voltage reference with respect to the supply voltage comprises a substrate bipolar transistor with a current source coupled to its base.

A two-stage comparator having an NMOS input transistor pair has the drain of the diode-connected NMOS transistor in the first voltage reference coupled to its non-inverting input, and the base of the substrate PNP transistor in the second voltage reference coupled to its inverting input, such that the comparator output changes state when the power supply voltage exceeds a predetermined threshold voltage. The first voltage reference has a positive temperature coefficient approximately equal to the magnitude of the negative temperature coefficient of the second voltage reference, such that the predetermined threshold voltage is relatively independent of absolute temperature.

An alternative embodiment of the power supply voltage monitoring circuit that provides an output signal when the power supply voltage measured with respect to ground exceeds a predetermined threshold voltage comprises a first voltage reference with respect to ground that varies inversely with absolute temperature and a second voltage reference with respect to the supply voltage that varies in direct proportion to absolute temperature. A comparator has the first voltage reference coupled to one input, and the second voltage reference coupled to the other input, such that the comparator output changes state when the power supply voltage exceeds a predetermined threshold voltage that is relatively independent of absolute temperature.

Further objects, features, and advantages of the present invention will become apparent from the following description and drawings.

DETAILED DESCRIPTION OF THE INVENTION

There is described herein a brown-out detector that offers distinct advantages when compared to the prior art. A somewhat qualitative introduction to the invention is presented below with reference to FIG. 1, a simplified block diagram of a brown-out detector in accordance with the present invention, generally depicted by the numeral 100.

Figure 1:
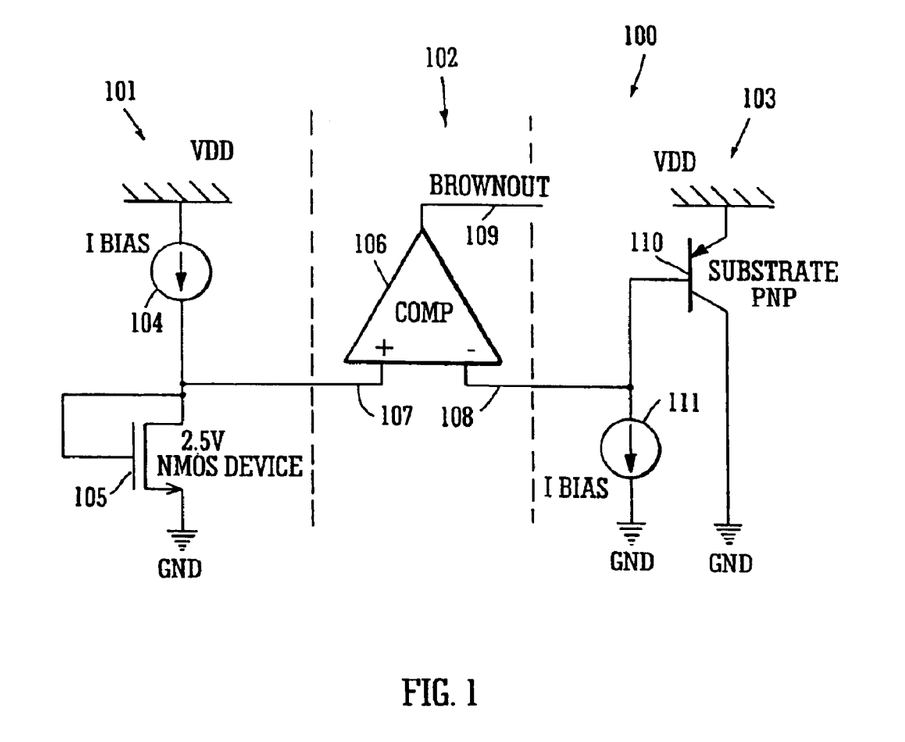
FIG. 1 is a simplified block diagram of a brown-out detector in accordance with the present invention.

The overall circuit 100 includes a first portion 101 that provides a voltage reference with respect to ground that varies in direct proportion to absolute temperature. In other words, the voltage reference is PTAT (directly proportional to absolute temperature). This first reference circuit includes a diode-connected NMOS transistor 105 and a current source 104 having a value equal to $I_{bias}$. The current value $I_{bias}$ is roughly invariant with respect to absolute temperature or ZTAT (zero variation with respect to absolute temperature). It is not strictly necessary that $I_{bias}$ be ZTAT, but having $I_{bias}$ remain relatively constant over temperature does keep the power consumption relatively constant over temperature as well.

The gate-to-source voltage Vgs of the NMOS transistor 105 (in strong inversion) can be expressed as follows:

$$Vgs = Vt + \sqrt{\frac{2 \cdot Id}{\mu_0 \cdot C_{ox} \cdot \frac{W}{L}}}$$

where Vt represents threshold voltage, $\mu_0$ is carrier mobility, Id is the drain current for the device, and W/L is the ratio of channel width to length (the shape factor). The expression under the radical can be simplified to Vc, the current carrying component, yielding the expression:

$$Vgs = Vt + Vc$$

Vt decreases with temperature at a rate roughly equal to 2.3 mV (millivolts) per degree C. Mobility $\mu_0$ also decreases with temperature. This means that Vc increases with temperature. Thus, if Id is fixed by scaling W/L, the temperature variation of the diode-connected Vgs can be adjusted—it can be made to increase with temperature, remain constant, or decrease with temperature. In this case, Vgs is made to have a positive temperature coefficient.

A second portion 103 of the circuit 100 provides a voltage reference with respect to Vdd that varies inversely with respect to absolute temperature. Thus, the reference provided by second circuit portion 103 is CTAT (complementary to absolute temperature). This second circuit portion 103 is implemented as a substrate PNP transistor 110.

As a practical matter, one only has access to the base and emitter of this device 110. It should be clear that the negative terminal 108 of the comparator 106 will be clamped approximately one diode drop below the supply voltage, provided that the supply voltage is high enough. The comparator 106 and its associated output signal 109 form a third portion 102 of the circuit 100.

Vbe (the base-emitter voltage) of the substrate PNP 110 has a negative temperature coefficient. Beta can be expected to increase by a factor of two from −40 to +85 degrees C., but this only contributes about 18 mV to an increase in Vbe. Thus, the negative input to the comparator 106 can be characterized as a level-shifted version of the supply voltage.

The circuit 100 operates effectively because the positive temperature coefficient of the NMOS device 105 in the first circuit portion 101, and the negative temperature coefficient associated with the substrate PNP 110 of the second circuit portion 103, can be made to cancel. This means that, as the analog supply voltage of the circuit 100, or Avdd, is swept from zero volts to its normal operating potential, at some voltage the negative input 108 to the comparator 106 will rise above the voltage at the positive input 107 of the comparator 106, and the comparator 106 will no longer indicate a state of brownout at its output 109. This trigger level will be relatively invariant with respect to temperature. However, the trigger level will vary along with integrated circuit layout and process parameters.

Figure 2:
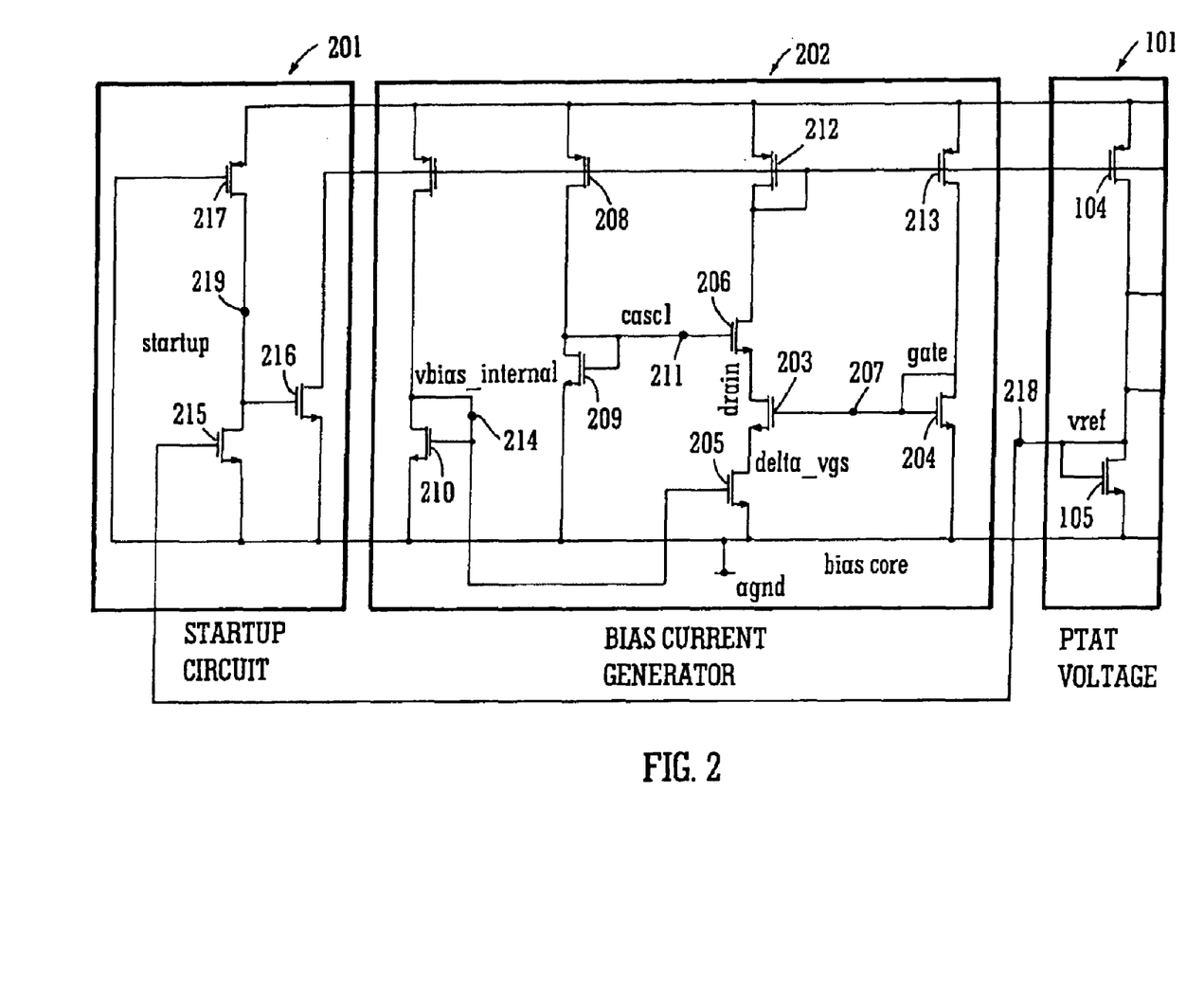
FIG. 2 depicts, in schematic form, a startup circuit, bias current generator, and PTAT voltage reference in accordance with one embodiment of the present invention.

In practice, the bias currents $I_{bias}$ are provided by a bias current circuit 202 illustrated in FIG. 2. The bias circuit 202 starts up of its own accord. All of the devices shown in this circuit 202 are five volt devices, except for NMOS FETs MN9 203 and MN10 204, which are 2.5 volt devices.

The MN9 203 and MN10 204 legs are the main legs of the circuit 202. MN9 203 and MN10 204 both operate in the sub-threshold region of operation. MN9 203 is scaled with respect to MN10 204 by a factor of 10:1. This scaling creates a ΔVgs across MN0 205, which is in the triode region—it is acting like a resistor. The ΔVgs varies directly in proportion to absolute temperature (is PTAT, in other words). The stabilized loop current is given by ΔVgs/R, with R being the resistance presented by MN0 205.

$$R = \frac{1}{\beta \cdot (\text{vbias\_internal} - Vt)}$$

The temperature dependence of beta is determined by the mobility:

$$\beta = \mu \cdot C_{ox} \cdot \frac{W}{L}$$

$$\mu \propto T^{-3/2}$$

and the temperature dependence of the mobility is known to be
where T is the absolute temperature. Thus, ΔVgs/R may be expressed as follows:

$$\frac{\Delta Vgs}{R} = \Delta Vgs \cdot \beta \cdot (Vgs - Vt)$$

$$\frac{\Delta Vgs}{R} = \Delta Vgs \cdot \beta \cdot Vc$$

$$\frac{\Delta Vgs}{R} = \Delta Vgs \cdot \sqrt{\mu} \cdot \sqrt{2 \cdot Id \cdot C_{ox} \cdot \frac{W}{L}}$$

The respective variations of ΔVgs and $\mu^{1/2}$ are known:

$$\Delta Vgs \propto T \sqrt{\mu} \propto T^{-3/4}$$

$$\therefore \Delta Vgs \cdot \sqrt{\mu} \propto T^{1/4}$$

Returning now to a description of the bias circuit 202, MN1 206 is a cascode device. MN1 206 protects the drain of MN9 203 from voltages above 2.5 volts. Note that the "gate" node 207 does not require this protection, since it is always guaranteed to be below 2.5 volts. This fact also helps during operation under low Vdd conditions. Power supply rejection is also helped.

MP4 208 and MN2 209 are used to set the cascode voltage casc1 211. MP7 212 and MP5 213 form the rest of the bias circuit core. This current mirror forces the current in both legs to be equal. This is not exactly true, because the drain voltage X and the voltage at the gate node 207 will differ quite a bit as the supply voltage is varied. However, one of the main objectives of this circuit is low voltage operation, and thus cascodes are avoided.

The gate of MN0 205 is hooked up to vbias_internal 214 as opposed to Vdd. The W/L of MN4 210 was fine-tuned with a view toward altering the temperature coefficient of the vbias_internal node 214. This adjustment of W/L has the effect of reducing the temperature variation of the bias current to some extent. Most mirror devices are operated in the strong inversion region of operation to ensure that current copying is accurate in the current mirrors.

MN5 215, MN40 216, and MP8 217 form a startup circuit 201. The operation is as follows. If no current flows in MN19 105, then node Vref 218 will remain at zero volts. This means that MN5 215 will be off. Thus, the startup node 219 will be high. This means MN40 216 will sink current out of the diode-connected MP7 212. This action gets the bias circuit 202 out of the zero-current condition. Once the circuit starts, then node Vref 218 will rise to a diode drop above ground. This turns on MN5 215, which pulls down the startup node 219 and turns off MN40 216. MP8 217 functions as a weak pullup device.

Figure 3:
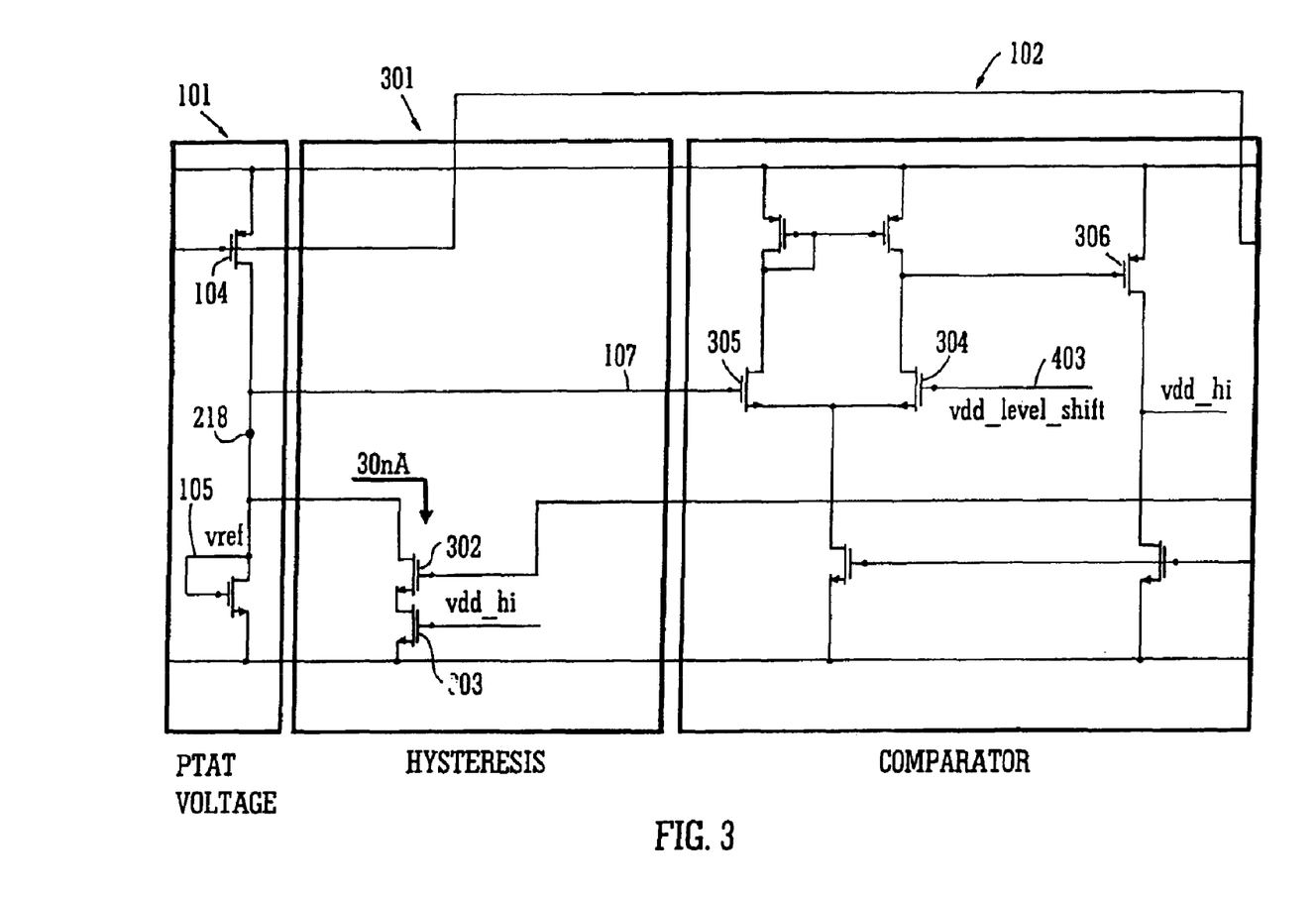
FIG. 3 illustrates a PTAT voltage reference, hysteresis circuit, and a comparator in accordance with one embodiment of the present invention.

As noted previously, NM19 105 and MP3 104 act to provide a voltage reference with respect to ground that is PTAT. This reference circuit 101 is also illustrated in FIG. 3. Circuit 301, that provides desirable hysteresis, is also shown in FIG. 3. MN38 302 and MN39 303 are included to provide some hysteresis on the threshold of the trigger point. Vref 218 is made to be PTAT by scaling the W/L (the MOS transistor shape factor) of MN19 105 to be very small.

As the hysteresis circuit 301 passes through its trigger point, MN39 303 is turned on. This diverts 30 nA (nanoamperes) away from MN19 105. This current diversion has the effect of dropping Vref 218 by −175 mV, and thus provides hysteresis. The resistance of MN39 303, while on, is on the order of a few kilohms at most, and thus the voltage drop across it is negligible.

Figure 4:
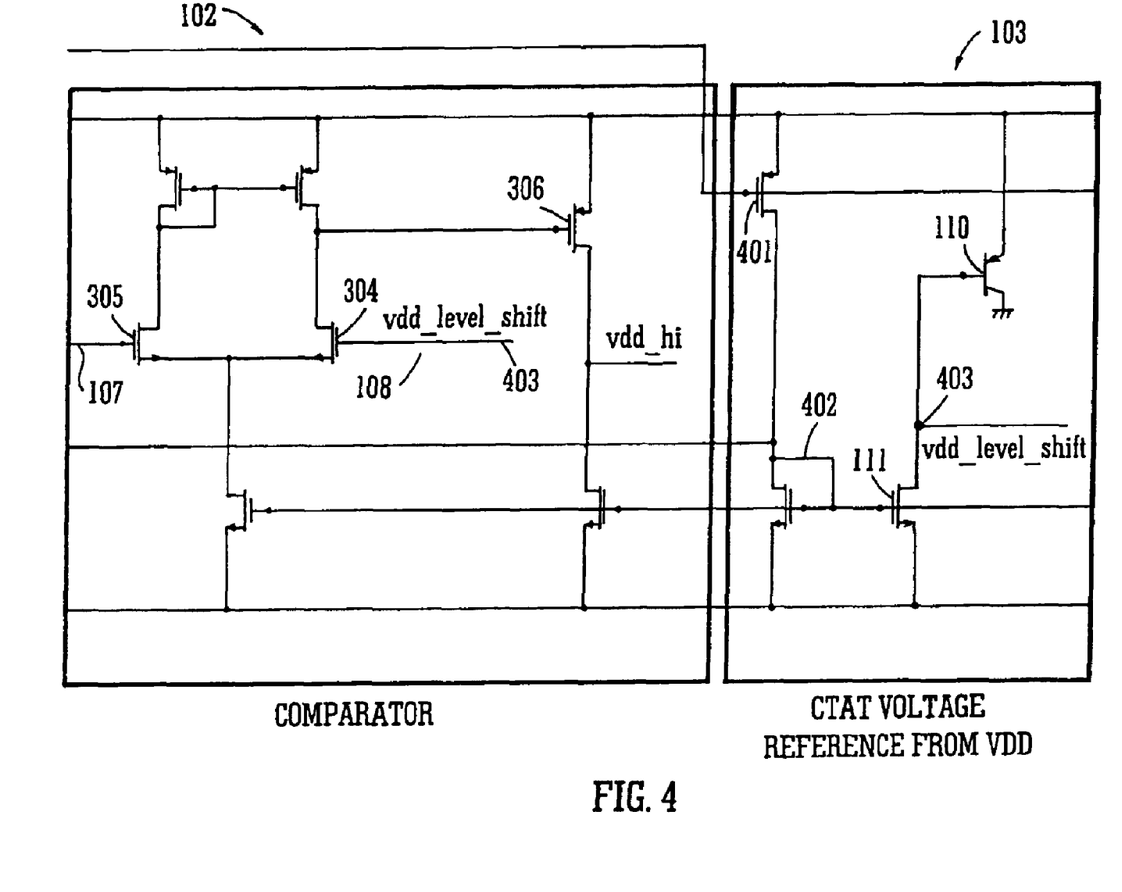
FIG. 4 is a schematic diagram of a comparator and CTAT voltage reference in accordance with one embodiment of the present invention.

As noted above, circuit portion 103, illustrated in greater detail in FIG. 4, is designed to provide a CTAT voltage reference with respect to Vdd. MN18 111 and QP3 110 are the substrate PNP transistor and the current source, respectively. MP15 401, MN14 402, and MN18 111 are required to generate a bias sink current for QP3 110.

Again, it is important to stress that in a small geometry CMOS process, such as the 0.25 micron process contemplated for the present invention, beta for a substrate PNP, such as qp3 110, is typically 2 or 3 and varies by a factor of two from −40 to +85 degrees C. This works to advantage, as only 120 nA (nanoamperes) or so flow to the substrate through the collector of qp3 110 in this instance. It should be clear from the circuit that the node "vdd_level_shift" 403 is a CTAT voltage with respect to Vdd. Of course, a substrate bipolar fabricated using a larger geometry could have a beta of 20 or 30, for example. A large beta would be disadvantageous for the present brown-out detector application. But, as noted, for fine line geometries such as 0.25 or 0.18 micron, beta is typically quite low, and the brown-out detector of the present invention is well-suited to these processes.

As shown in both FIGS. 3 and 4, the comparator 102 (described briefly above) is biased from the bias circuit 202. The comparator 102 is basically a simple two-stage comparator. One of skill in the art may wonder why an NMOS input pair (comprising MN34 304 and MN35 305) is employed in this application. The reason for this is quite clear when one considers the input signals. Basically, the voltage "vdd_level_shift" 403, applied to the inverting input 108 of the comparator 102, will be a diode drop below Avdd, the analog supply voltage being monitored in this instance. The input to the gate of MN35 305, which forms the non-inverting input 107 of the comparator 102, is the diode-connected NMOS transistor MN19 105. As noted previously, this diode-connected NMOS MN19 105 is operating in strong inversion, and its voltage typically varies from about 1.2 to 1.4 volts over temperature. Thus, it is clear that an NMOS input pair is suitable, because the input signals are above 1 volt normally. MP38 306 is scaled appropriately to minimize offset in the comparator 102. As one might expect, the devices in this circuit are scaled such that MN34 and MN35 dominate in terms of offset.

Figure 5:
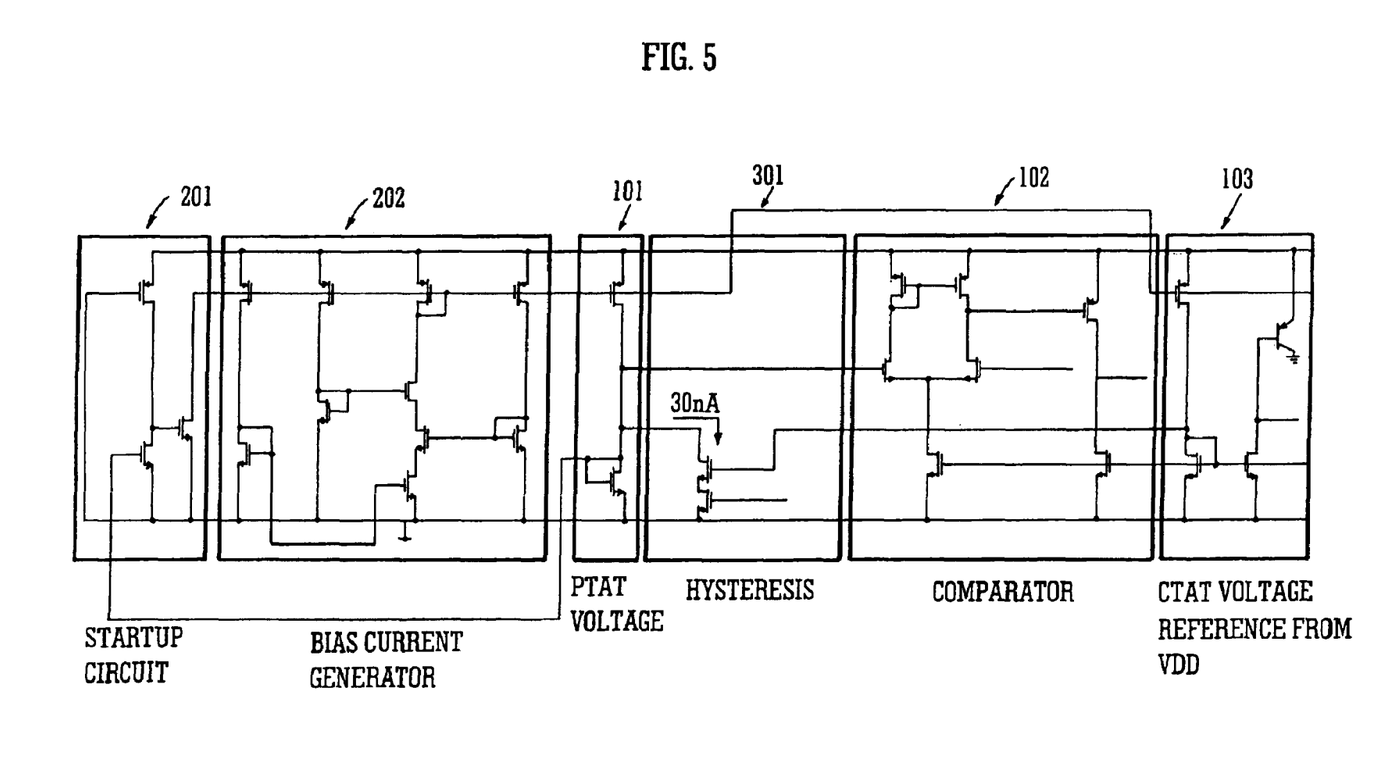
FIG. 5 shows the preferred interconnection of the circuits depicted in FIGS. 2–4.

FIG. 5 provides a schematic overview of the preferred interconnection of the circuits described above. Startup circuit 201 ensures that the bias current generator 202 is properly directed out of its initial zero current condition. The bias current generator 202 provides temperature-stabilized bias currents throughout the interconnected circuitry, but particularly for the PTAT voltage reference 101 and the CTAT voltage reference 103.

Figure 6:
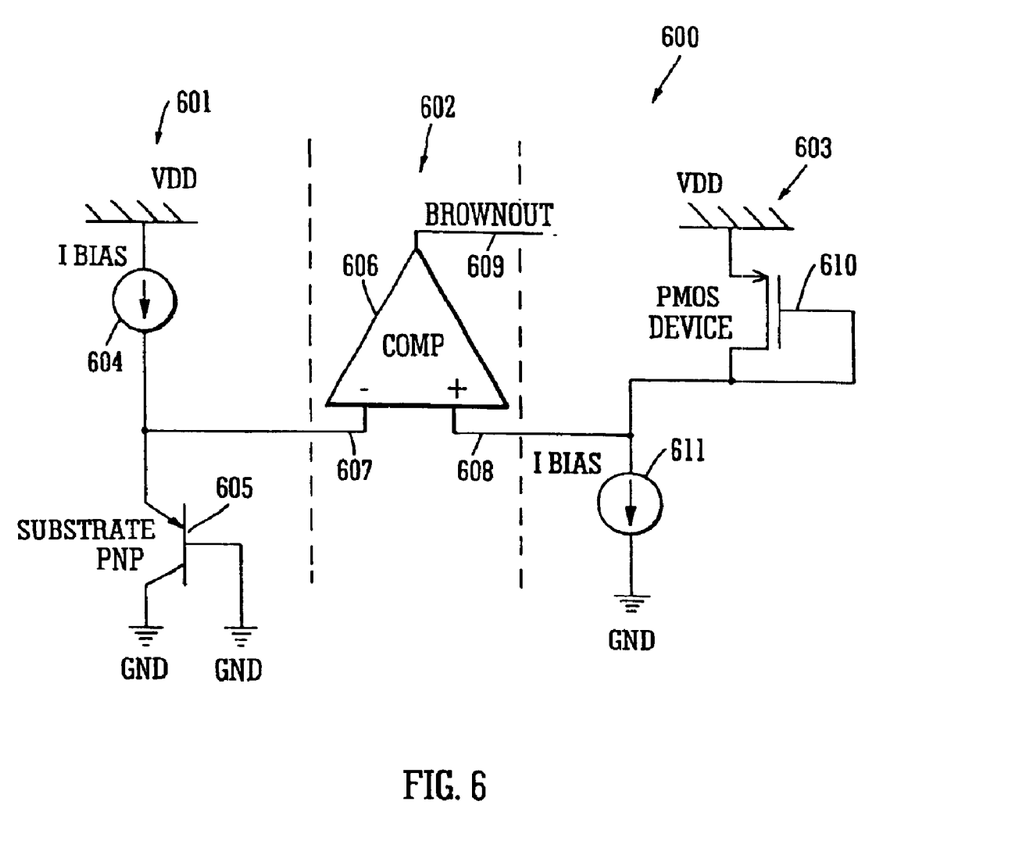
FIG. 6 depicts an alternative embodiment of the present invention in block diagram form.

FIG. 6 is a simplified block diagram of an alternative embodiment of the present invention, generally depicted by the numeral 600. This alternative circuit 600 features a first portion 601 that provides a CTAT voltage with respect to ground. The CTAT voltage is implemented by a substrate PNP transistor 605. The bias current source $I_{bias}$ 604 may be ZTAT. Of course, this is not strictly necessary, but does tend to keep power consumption constant over temperature. The CTAT voltage is coupled to the negative terminal 607 of a comparator 606.

A second portion 603 of the circuit 600 provides a PTAT voltage with respect to Vdd. Vgs of the PMOS transistor 610 is made PTAT by scaling the aspect ratio W/L of the PMOS device 610 in much the same fashion as described previously for the NMOS transistor 105 of FIG. 1. The resultant PTAT voltage is coupled to the positive terminal 608 of the comparator 606.

The PTAT voltage is scaled such that the sum of the CTAT and PTAT voltages remains constant over temperature. As a result, at a predetermined Vdd level, the BROWNOUT output signal 609 of the comparator 606 is asserted when the voltage at the positive terminal 607 is greater than the voltage at the negative terminal 608. The Vdd level trip point will remain relatively constant over temperature due to the fact that the PTAT and CTAT voltages sum to a constant voltage over temperature.

There has been described herein a brown-out detector that offers distinct advantages when compared with the prior art. It will be apparent to those skilled in the art that modifications may be made without departing from the spirit and scope of the invention. Accordingly, it is not intended that the invention be limited except as may be necessary in view of the appended claims.

What is claimed is:

1. A power supply voltage monitoring circuit that provides an output signal when a power supply voltage measured with respect to ground exceeds a predetermined threshold voltage, the monitoring circuit comprising:

a first voltage reference providing a first reference voltage with respect to ground, said first reference voltage varying in direct proportion to absolute temperature;

a second voltage reference supplying a second reference voltage with respect to the supply voltage, said second reference voltage varying inversely with absolute temperature; and a comparator having the first reference voltage coupled to one input, and the second reference voltage coupled to the other input, such that the comparator output changes state when the power supply voltage exceeds the predetermined threshold voltage, which is relatively independent of absolute temperature.

2. The power supply voltage monitoring circuit of claim 1, wherein the first voltage reference with respect to ground comprises a diode-connected NMOS transistor in series with a current source.

3. The power supply voltage monitoring circuit of claim 2, wherein the source of the diode-connected NMOS transistor is coupled to ground, and the current source is coupled between the power supply voltage and the drain of the diode-connected NMOS transistor.

4. The power supply voltage monitoring circuit of claim 1, wherein the second voltage reference with respect to the supply voltage comprises a substrate bipolar transistor with a current source coupled to its base.

5. The power supply voltage monitoring circuit of claim 4, wherein the substrate bipolar transistor comprises a substrate PNP transistor.

6. The power supply voltage monitoring circuit of claim 5, wherein beta of the substrate PNP transistor is no more than 5.

7. The power supply voltage monitoring circuit of claim 5, wherein the emitter of the substrate PNP transistor is coupled to the power supply voltage, the collector of the substrate PNP transistor is coupled to ground, and the current source is coupled between the base of the substrate PNP transistor and ground.

8. The power supply voltage monitoring circuit of claim 3, wherein the drain of the diode-connected NMOS transistor is coupled to the non-inverting input of the comparator.

9. The power supply voltage monitoring circuit of claim 7, wherein the base of the substrate PNP transistor is coupled to the inverting input of the comparator.

10. The power supply voltage monitoring circuit of claim 1, wherein the first reference voltage has a positive temperature coefficient approximately equal to the magnitude of the negative temperature coefficient of the second reference voltage.

11. The power supply voltage monitoring circuit of claim 1, wherein the comparator is a two-stage comparator having an NMOS input transistor pair.

12. The power supply voltage monitoring circuit of claim 2, further comprising a hysteresis circuit interposed between the first voltage reference and the comparator, the hysteresis circuit comprising a current sink that diverts current from the diode-connected NMOS transistor at a predetermined trigger voltage.

13. A power supply voltage monitoring circuit that provides an output signal when a power supply voltage measured with respect to ground exceeds a predetermined threshold voltage, the monitoring circuit comprising:

a first voltage reference that provides a first reference voltage with respect to ground that varies in direct proportion to absolute temperature, wherein the first voltage reference comprises a diode-connected NMOS transistor in series with a current source;

a second voltage reference that provides a second reference voltage that varies inversely with absolute temperature, wherein the second voltage reference comprises a substrate bipolar transistor with a current source coupled to its base; and a two-stage comparator having an NMOS input transistor pair, with the drain of the diode-connected NMOS transistor in the first voltage reference coupled to its non-inverting input, and the base of the substrate PNP transistor in the second voltage reference coupled to its inverting input, such that the comparator output changes state when the power supply voltage exceed the predetermined threshold voltage;

wherein the first reference voltage has a positive temperature coefficient approximately equal to the magnitude of the negative temperature coefficient of the second reference voltage, such that the predetermined threshold voltage is relatively independent of absolute temperature.

14. The power supply voltage monitoring circuit of claim 13, wherein the source of the diode-connected NMOS transistor in the first voltage reference is coupled to ground, and the current source is coupled between the power supply voltage and the drain of the diode-connected NMOS transistor.

15. The power supply voltage monitoring circuit of claim 13, wherein the substrate bipolar transistor in the second voltage reference comprises a substrate PNP transistor.

16. The power supply voltage monitoring circuit of claim 15, wherein beta of the substrate PNP transistor is no more than 5.

17. The power supply voltage monitoring circuit of claim 15, wherein the emitter of the substrate PNP transistor is coupled to the power supply voltage, the collector of the substrate PNP transistor is coupled to ground, and the current source is coupled between the base of the substrate PNP transistor and ground.

18. The power supply voltage monitoring circuit of claim 13, further comprising a hysteresis circuit interposed between the first voltage reference and the comparator, the hysteresis circuit comprising a current sink that diverts current from the diode-connected NMOS transistor at a predetermined trigger voltage.

19. A power supply voltage monitoring circuit that provides an output signal when a power supply voltage measured with respect to ground exceeds a predetermined threshold voltage, the monitoring circuit comprising:

a first voltage reference that provides a first reference voltage with respect to ground that varies in direct proportion to absolute temperature, wherein the first voltage reference comprises a diode-connected NMOS transistor in series with a current source;

a second voltage reference that provides a second reference voltage with respect to the supply voltage that varies inversely with absolute temperature, wherein the second voltage reference comprises a substrate bipolar transistor with a current source coupled to its base;

a two-stage comparator having an NMOS input transistor pair, with the drain of the diode-connected NMOS transistor in the first voltage reference coupled to its non-inverting input, and the base of the substrate PNP transistor in the second voltage reference coupled to its inverting input, such that the comparator output changes state when the power supply voltage exceeds the predetermined threshold voltage; and a hysteresis circuit interposed between the first voltage reference and the comparator, the hysteresis circuit comprising a current sink that diverts current from the diode-connected NMOS transistor at a predetermined trigger voltage;

wherein the first reference voltage has a positive temperature coefficient approximately equal to the magnitude of the negative temperature coefficient of the second reference voltage, such that the predetermined threshold voltage is relatively independent of absolute temperature.

20. The power supply voltage monitoring circuit of claim 19, wherein the source of the diode-connected NMOS transistor in the first voltage reference is coupled to ground, and the current source is coupled between the power supply voltage and the drain of e diode-connected NMOS transistor.

21. The power supply voltage monitoring circuit of claim 19, wherein the substrate bipolar transistor in the second voltage reference comprises a substrate PNP transistor.

22. The power supply voltage monitoring circuit of claim 21, wherein beta of the substrate PNP transistor is no more than 5.

23. The power supply voltage monitoring circuit of claim 21, wherein the emitter of the substrate PNP transistor is coupled to the power supply voltage, the collector of the substrate PNP transistor is coupled to ground, and the current source is coupled between the base of the substrate PNP transistor and ground.

24. A power supply voltage monitoring circuit that provides an output signal when a power supply voltage measured with respect to ground exceeds a predetermined threshold voltage, the monitoring circuit comprising:

a first voltage reference that provides a first reference voltage with respect to ground that varies inversely with absolute temperature;

a second voltage reference that provides a second reference voltage with respect to the supply voltage that varies in direct proportion to absolute temperature; and a comparator having the first reference voltage coupled to one input, and the second reference voltage coupled to the other input, such that the comparator output changes state when a power supply voltage exceeds a predetermined threshold voltage that is relatively independent of absolute temperature.

* * * * *